(12) United States Patent
Park

(10) Patent No.: US 10,757,823 B2
(45) Date of Patent: Aug. 25, 2020

(54) DISPLAY APPARATUS

(71) Applicant: LG Display Co., Ltd., Seoul (KR)

(72) Inventor: Sangdae Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/509,355

(22) Filed: Jul. 11, 2019

(65) Prior Publication Data

US 2020/0022271 A1    Jan. 16, 2020

(30) Foreign Application Priority Data

Jul. 13, 2018    (KR) .................. 10-2018-0081674

(51) Int. Cl.
*H05K 5/00*    (2006.01)
*H05K 5/02*    (2006.01)

(52) U.S. Cl.
CPC ......... *H05K 5/0017* (2013.01); *H05K 5/0217* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,191,886 B1 * | 2/2001 | Sinkoff | .................. | G03B 21/58 160/24 |
| 7,559,163 B2 * | 7/2009 | Ofuji | .................... | G03B 21/58 160/265 |
| 9,460,330 B2 * | 10/2016 | Lee | .................... | G06F 21/32 |
| 9,483,081 B2 * | 11/2016 | Lee | .................... | G06F 1/1616 |
| 9,609,225 B2 * | 3/2017 | Kwon | ................. | G06F 3/04845 |
| 9,743,542 B2 * | 8/2017 | Heo | ..................... | H05K 5/0217 |
| 9,756,757 B2 * | 9/2017 | Park | ..................... | G09F 9/301 |
| 9,844,152 B2 * | 12/2017 | Heo | ................. | G02F 1/133305 |
| 9,864,412 B2 * | 1/2018 | Park | ..................... | G06F 1/1656 |
| 9,911,369 B2 * | 3/2018 | Kim | ..................... | G09F 9/301 |
| 10,007,475 B2 * | 6/2018 | Jeon | .................... | G06F 3/04817 |
| 10,008,135 B2 * | 6/2018 | Lim | ..................... | G09F 9/00 |
| 10,013,955 B2 * | 7/2018 | Oh | ....................... | G06F 3/0482 |
| 10,061,358 B2 * | 8/2018 | Lee | .................... | H04M 1/0237 |
| 10,111,344 B2 * | 10/2018 | Han | ..................... | H05K 1/028 |
| 10,111,346 B2 * | 10/2018 | Seo | ..................... | G06F 3/044 |
| 10,143,095 B2 * | 11/2018 | Kim | ..................... | G06F 1/1652 |
| 10,203,863 B2 * | 2/2019 | Kwon | ................... | G06F 3/0487 |
| 10,209,742 B2 * | 2/2019 | Shin | .................... | G06F 1/1624 |

(Continued)

FOREIGN PATENT DOCUMENTS

| | | |
|---|---|---|
| KR | 10-2016-0141255 | 12/2016 |
| KR | 10-2017-0040643 | 4/2017 |
| KR | 10-2017-0081559 | 7/2017 |

*Primary Examiner* — Lisa Lea-Edmonds
(74) *Attorney, Agent, or Firm* — Seed IP Law Group LLP

(57) ABSTRACT

A display apparatus includes a display panel, a body to which the display panel is movably coupled, a first connection part connecting the body to the display panel, a second connection part disposed apart from the first connection part to connect the body to the display panel, and an elastic part elastically connected between the first connection part and the second connection part. Accordingly, the display panel may be enlarged and reduced with only an action of a user's hand by using the elastic part without a separate driving power, and thus, a total size and weight may decrease, thereby increasing the convenience of keeping and movement.

18 Claims, 8 Drawing Sheets

(56) References Cited

U.S. PATENT DOCUMENTS

| | | | |
|---|---|---|---|
| 10,229,629 B2* | 3/2019 | Yang | G09G 3/2096 |
| 10,306,787 B2* | 5/2019 | Kang | H05K 5/0217 |
| 10,321,583 B2* | 6/2019 | Seo | H04N 5/64 |
| 10,379,720 B2* | 8/2019 | Ryu | G06F 3/0481 |
| 10,448,521 B2* | 10/2019 | Seo | H05K 1/0203 |
| 10,490,169 B2* | 11/2019 | Oh | G06F 3/0482 |
| 10,506,726 B2* | 12/2019 | Kang | G06F 1/1601 |
| 2013/0058063 A1* | 3/2013 | O'Brien | G06F 1/1624 |
| | | | 361/807 |
| 2014/0247544 A1* | 9/2014 | Ryu | G09F 11/18 |
| | | | 361/679.01 |
| 2016/0202729 A1* | 7/2016 | Lee | G06F 1/1652 |
| | | | 361/750 |
| 2018/0136835 A1* | 5/2018 | Heo | G06F 1/163 |
| 2018/0198896 A1* | 7/2018 | Kang | H04M 1/02 |
| 2018/0198899 A1* | 7/2018 | Lee | H04M 1/0266 |
| 2019/0371214 A1* | 12/2019 | Kim | G09F 11/02 |

\* cited by examiner

DISPLAY APPARATUS

CROSS-REFERENCE TO RELATED APPLICATIONS

This application claims the benefit of the Korean Patent Application No. 10-2018-0081674, filed on Jul. 13, 2018, which is hereby incorporated by reference as if fully set forth herein.

BACKGROUND

Technical Field

The present disclosure relates to a display apparatus.

Description of the Related Art

Recently, as society advances to the information-oriented society, the field of display apparatuses for displaying and displaying a massive amount of information has rapidly advanced, and correspondingly, various flat panel display apparatuses have been developed and are attracting much attention.

Flat panel display apparatuses use a glass substrate for enduring high heat which occurs in a manufacturing process, and due to this, there is a limitation in realizing thinness, weight-lightness, and flexibility.

Therefore, by using a material having flexibility like plastic instead of a glass substrate having no flexibility, flexible display apparatuses are manufactured to maintain display performance even when being bent like paper, and thus, are attracting much attention as next-generation flat panel display apparatuses.

By using a plastic substrate instead of glass, flexible display apparatuses may be categorized into unbreakable display apparatuses having high durability, bendable display apparatuses which are not broken and are bendable, rollable display apparatuses capable of being rolled, foldable display apparatuses, and slidable display apparatuses enabling a screen to be unloaded therefrom and inserted thereinto. Such flexible display apparatuses are good in space usability, interior, and design and may be applied to various application fields.

Particularly, research of slidable display apparatuses is being actively done for improving thinness, weight-lightness, miniaturization, and portability recently.

BRIEF SUMMARY

Accordingly, the present disclosure is directed to providing a display apparatus that substantially obviates one or more problems due to limitations and disadvantages of the related art.

The present disclosure describes providing a display apparatus in which a display panel is enlarged or reduced without a separate driving power.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a display panel, a body to which the display panel is movably coupled, a first connection part connecting the body to the display panel, a second connection part disposed apart from the first connection part to connect the body to the display panel, and an elastic part elastically connected between the first connection part and the second connection part.

A display apparatus may be summarized as comprising: a display panel; a body, the display panel movably coupled to the body; a first connection rod connecting the body to the display panel; a second connection rod connecting the body to the display panel, the second connection rod disposed apart from the first connection rod; and a member of elastic material connected to the first connection rod and to the second connection rod, wherein the member of elastic material contracts based on an elastic restoring force to decrease a separation distance between the first connection rod and the second connection rod.

The body may comprise an accommodating groove accommodating the first connection rod, the second connection rod, the member of elastic material, and a portion of the display panel. The body may comprise: an upper frame, an upper portion of the display panel coupled to the upper frame; and a lower frame, a lower portion of the display panel coupled to the lower frame, wherein each of the upper frame and the lower frame comprises a guide groove that, in operation, guides movement of the display panel. The guide groove of each of the upper frame and the lower frame may communicate with an outside of the body so that a portion of the display panel can be unloaded to the outside of the body.

The display apparatus may further comprise a panel frame coupled to one side of the display panel and disposed between an upper portion and a lower portion of the display panel. The body may comprise an inserting groove, and a portion of the panel frame may be inserted into the inserting groove. The display apparatus may further comprise a side frame disposed between the upper frame and the lower frame and in one side of the body, wherein the side frame contacts the panel frame inserted into the inserting groove. The panel frame may comprise: an inserting member, wherein a portion of the inserting member is inserted into the inserting groove; and a protrusion member protruding from the inserting member and exposed at an outside of the body, and the protrusion member is supported by the body.

The display apparatus may further comprise a guide roll disposed between the upper frame and the lower frame and disposed at one side of the body, wherein the guide groove of each of the upper frame and the lower frame comprises a curve portion so that the display panel is bent to surround a portion of the guide roll. The guide roll may rotate based on moving of the display panel. The display panel disposed in the curve portion may display an image differing from an image displayed by the display panel disposed in a portion other than the curve portion. The display apparatus may further comprise a panel frame connecting the first connection rod and the second connection rod to the display panel, wherein the panel frame is disposed between the upper portion and the lower portion of the display panel and is coupled to one side of the display panel.

The panel frame may have a length which is shorter than a length between the upper portion and the lower portion of the display panel. The display apparatus may further comprise a side frame disposed between the upper frame and the lower frame and in the one side of the body, wherein the member of elastic material is disposed between the side frame and the panel frame. The display apparatus may further comprise: a first fixture coupling one side of the first connection rod to the body; a second fixture disposed apart from the first fixture to couple one side of the second connection rod to the body; and a third connection rod connecting the one side of the first connection rod to the one side of the second connection rod, wherein the first fixture and the second fixture are coupled to the body so that the third connection rod is disposed vertical and transverse to a moving direction of the display panel.

The member of elastic material may comprise: a first through hole, the first connection rod passing through the first through hole; and a second through hole, the second connection rod passing through the second through hole, and the first through hole may be spaced apart from the second through hole. The member of elastic material may comprise a band having elasticity or a compression spring having elasticity. When one side of the display panel is unloaded from the body, the member of elastic material may stretch, and when the member of elastic material contracts based on an elastic restoring force, the member of elastic material may move the display panel so that one side of the display panel is inserted into the body, and an elastic direction of the member of elastic material may differ from a moving direction of the display panel. The display apparatus may further comprise: a cover coupled to the body to cover the accommodating groove; and a button coupled to the cover to limit movement of the display panel.

In the display apparatus according to the present disclosure, the display panel may be enlarged and reduced with only an action of a user's hand by using an elastic part without a separate driving power, and thus, total size and weight may decrease, thereby increasing the convenience of keeping and movement.

Moreover, a user may directly adjust a size of a front region providing an image on the basis of situations of an ambient environment or a preference of the user, thereby increasing satisfaction of the user.

In addition to the aforesaid objects of the present disclosure, other features and advantages of the present disclosure will be described below, but will be clearly understood by those skilled in the art from descriptions below.

It is to be understood that both the foregoing general description and the following detailed description of the present disclosure are exemplary and explanatory and are intended to provide further explanation of the disclosure.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1A:
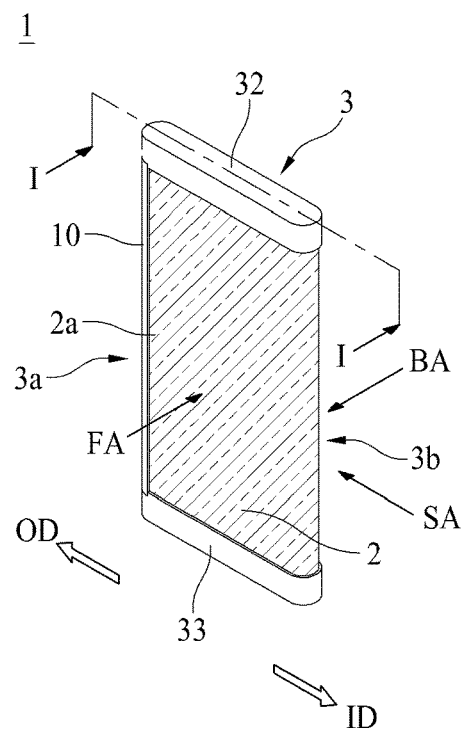
FIG. 1A is a schematic front perspective view illustrating an inserted state of a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. The terms are merely for differentiating one element from another element, and the essence, sequence, order, or number of a corresponding element should not be limited by the terms. It will be understood that when an element or layer is described as being "connected," "coupled," or "adhered" to another element or layer, the element or layer can be directly connected or adhered to the other element or layer, but the other element or layer can be "disposed" between elements or layers, or elements or layers can be "connected," "coupled," or "adhered" to each other through the other element or layer.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of a display apparatus according to the present disclosure will be described in detail with reference to the accompanying drawings. In adding reference numerals to elements of each of the drawings, although the same elements are illustrated in other drawings, like reference numerals may refer to like elements.

Figure 1B:
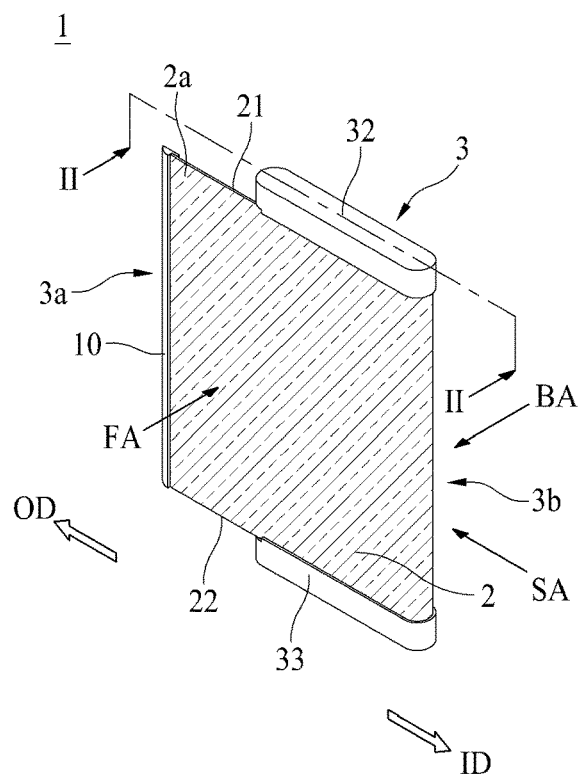
FIG. 1B is a schematic front perspective view illustrating an unloaded state of a display apparatus according to an embodiment of the present disclosure.
Figure 2:
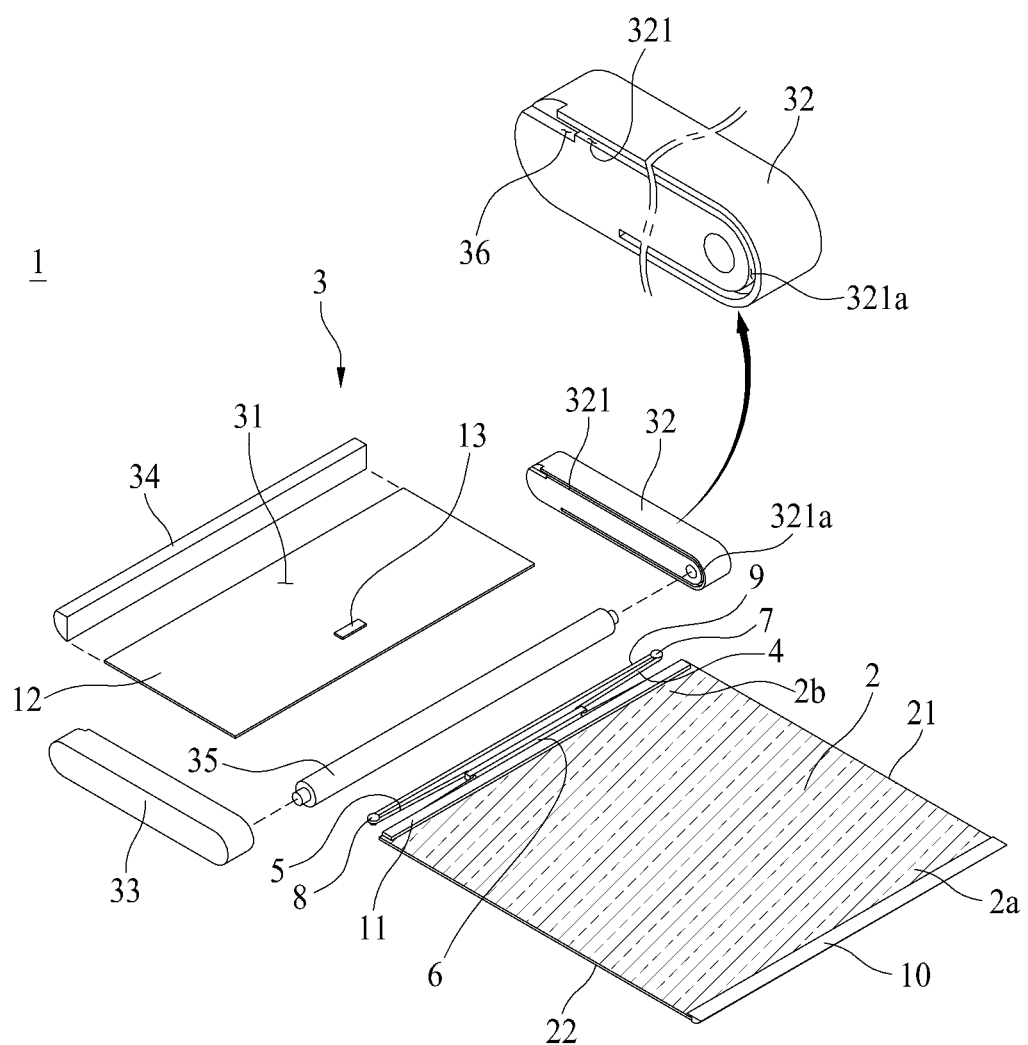
FIG. 2 is a schematic exploded perspective view of a display apparatus according to an embodiment of the present disclosure.
Figure 3A:
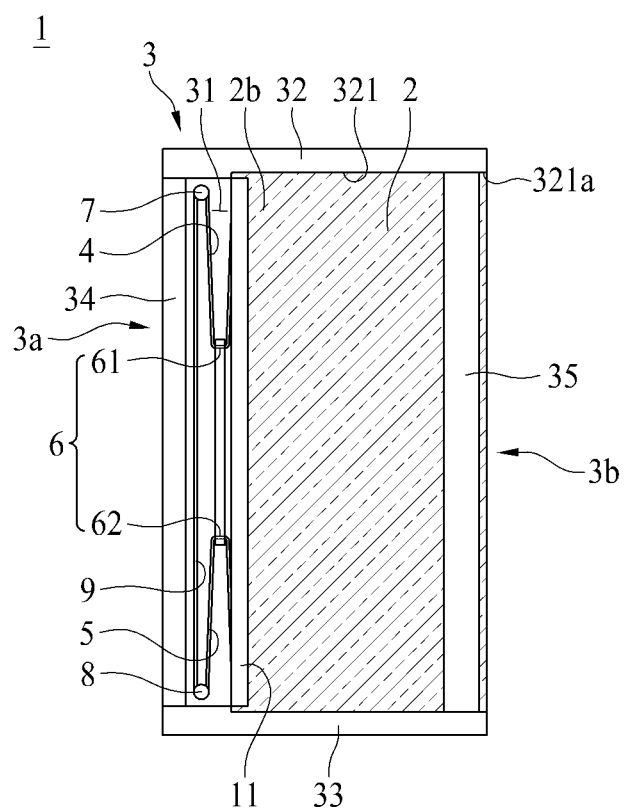
FIG. 3A is a schematic internal plan view taken along line I-I illustrated in FIG. 1A.
Figure 3B:
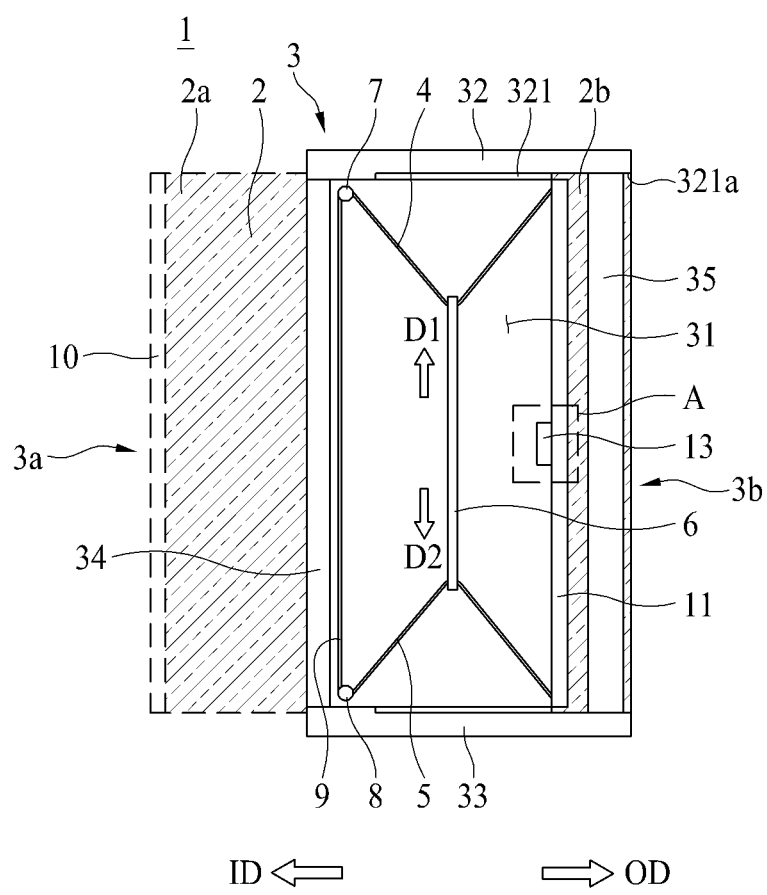
FIG. 3B is a schematic internal plan view taken along line II-II illustrated in FIG. 1B.

FIG. 1A is a schematic front perspective view illustrating an inserted state of a display apparatus 1 according to an embodiment of the present disclosure, and FIG. 1B is a schematic front perspective view illustrating an unloaded state of the display apparatus 1 according to an embodiment of the present disclosure. FIG. 2 is a schematic exploded perspective view of the display apparatus 1 according to an embodiment of the present disclosure. FIG. 3A is a schematic internal plan view taken along line I-I illustrated in FIG. 1A, and FIG. 3B is a schematic internal plan view taken along line II-II illustrated in FIG. 1B.

Referring to FIGS. 1A to 3B, the display apparatus 1 according to an embodiment of the present disclosure may include a display panel 2, a body 3, a first connection rod (or set of rods), shaft (or set of shafts), or strut (or set of struts), which may be referred to herein as a "first connection part 4," a second connection rod (or set of rods), shaft (or set of shafts), or strut (or set of struts), which may be referred to herein as a "second connection part 5," and a member or piece of elastic material, which may be referred to herein as an "elastic part 6."

The display panel 2 may be a display apparatus which displays an image. The display panel 2 may be a flexible display panel which is manufactured by using a material having flexibility like plastic so as to maintain display performance even when being bent like paper. The display panel 2 according to an embodiment may have a wholly tetragonal plate shape, but is not limited thereto and may have various shapes.

The display panel 2 may be movably coupled to the body 3. The display panel 2 according to an embodiment may be moved to enlarge a region of the display panel seen by a user as illustrated in FIG. 1B, or may be moved to reduce the region of the display panel seen by the user as illustrated in FIG. 1A. Hereinafter, a direction in which the region of the display panel is enlarged may be referred to as an unloading direction (an OD arrow direction), and a direction in which the region of the display panel is reduced may be referred to as an inserting direction (an ID arrow direction).

The display panel 2 may be moved by the user in the unloading direction (the OD arrow direction). For example, the user may grip or contact one side 2a of the display panel 2 with a hand and may move the display panel 2 in the unloading direction (the OD arrow direction). However, the present disclosure is not limited thereto, and the user may contact an arbitrary portion of the display panel 2 exposed at a front portion and may move the display panel 2 in the unloading direction (the OD arrow direction). Here, the front portion may denote a direction, enabling the user to see an image zoomed-in as large as possible, of directions which enable the user to see the image displayed by the display panel 2. For example, a region, disposed in the front portion, of the display panel 2 may be a front region FA illustrated in FIG. 1A. The one side 2a of the display panel 2 may denote an end portion of the display panel 2 in the unloading direction (the OD arrow direction) in the front portion. In a state where a size of the display panel 2 is enlarged, the display panel 2 may be moved by the elastic part 6 in the inserting direction (the ID arrow direction).

The display panel 2, as illustrated in FIGS. 1A to 3B, may be provided in a bent state. Therefore, a direction in which the display panel 2 moves in the front portion may be opposite to a direction in which the display panel 2 moves in a rear portion. For example, when it is assumed that the one side 2a of the display panel 2 disposed in the front portion moves in the unloading direction (the OD arrow direction) or the inserting direction (the ID arrow direction), the other side 2b of the display panel 2 disposed in the rear portion may move in a direction opposite to the direction. In the present disclosure, with respect to the front portion, a direction (i.e., an unloading direction) in which a screen is enlarged may be defined as the unloading direction (the OD arrow direction), and a direction (i.e., an inserting direction) in which the screen is reduced may be defined as the inserting direction (the ID arrow direction).

As the display panel 2 moves in the unloading direction (the OD arrow direction) or the inserting direction (the ID arrow direction), a portion of the display panel 2 covered by a below-described cover may be exposed at the outside, or an exposed portion may be covered by the cover. As the display panel 2 moves in the unloading direction (the OD arrow direction), a size of the display panel 2 exposed at the front portion may increase, and thus, the user may see a wider-range image or a zoomed-in image compared to before a size increases.

An upper portion 21 and a lower portion 22 of the display panel 2 may be coupled to the body 3. The upper portion 21 of the display panel 2 may denote an upper side portion of the display panel 2 in FIG. 1B. The lower portion 22 of the display panel 2 may denote a lower side portion of the display panel 2 in FIG. 1B. The upper portion 21 and the lower portion 22 of the display panel 2 may be movably coupled to the body 3.

Referring to FIGS. 1A to 3B, the display panel 2 may be movably coupled to the body 3. The body 3 according to an embodiment may have a wholly tetragonal shape, but is not limited thereto.

The body 3 may include one side 3a and the other side 3b. In a state where the display panel 2 is inserted into the body 3 as illustrated in FIG. 1A, the one side 3a of the body 3 may be a portion where the one side 2a of the display panel 2 is disposed. In this case, a portion inserted into the body 3 may be the other side 2b of the display panel 2. The other side 3b of the body 3 may be a portion opposite to the one side 3a of the body 3 with respect to the front region FA in FIG. 1A. A bending portion of the display panel 2 may be disposed in the other side 3b of the body 3. The body 3 may include an accommodating groove 31, an upper frame 32, a lower frame 33, a side frame 34, and a guide roll 35.

Figure 4:
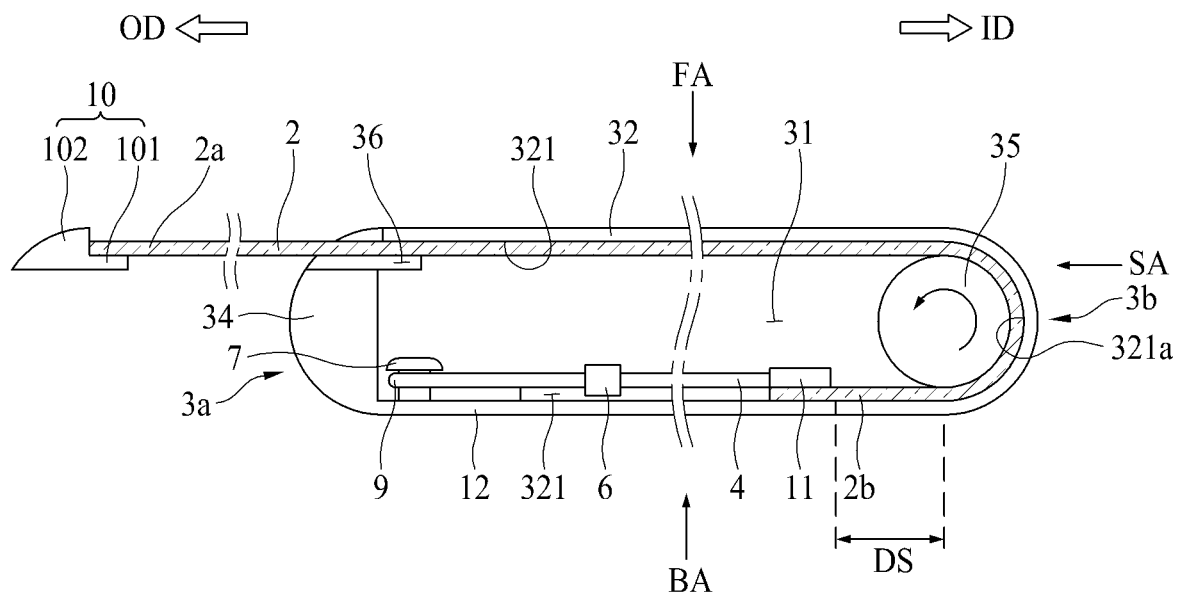
FIG. 4 is a schematic side view of an upper frame illustrated in FIG. 2 in an unloaded state.
Figure 5:
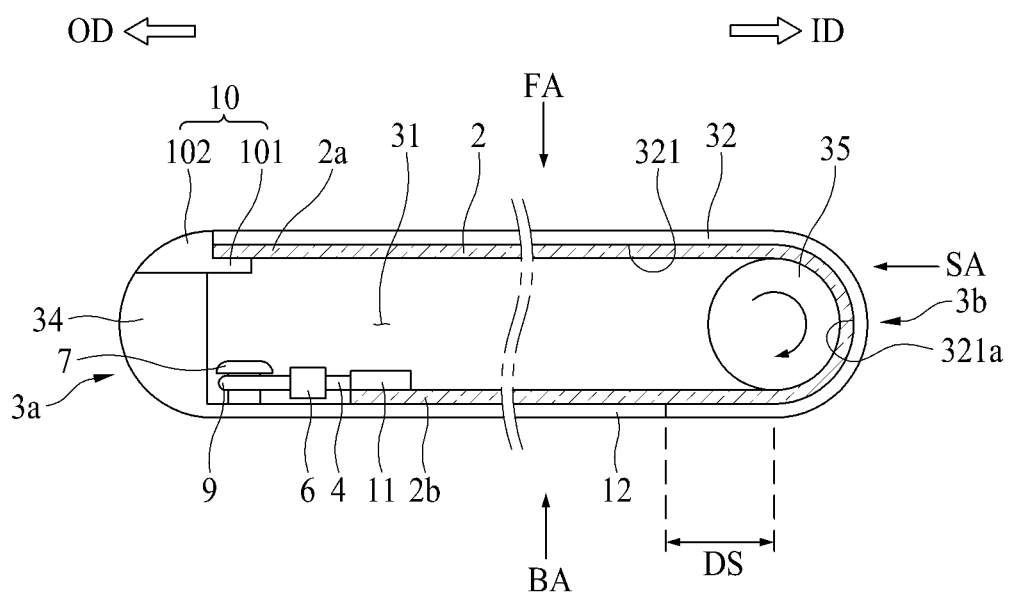
FIG. 5 is a schematic side view of the upper frame illustrated in FIG. 2 in an inserted state.
Figure 6:
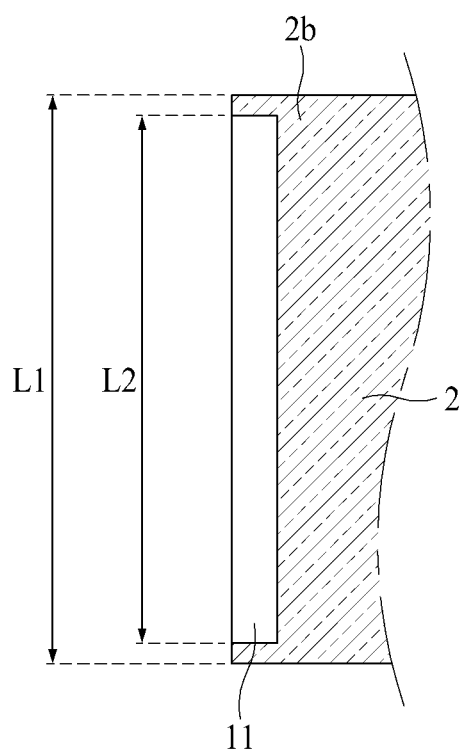
FIG. 6 is a schematic view showing a result obtained by comparing lengths of a second panel frame and a display panel each illustrated in FIG. 2.

FIG. 4 is a schematic side view of the upper frame illustrated in FIG. 2 in an unloaded state. FIG. 5 is a schematic side view of the upper frame illustrated in FIG. 2 in an inserted state. FIG. 6 is a schematic view showing a result obtained by comparing lengths of a second panel frame and a display panel each illustrated in FIG. 2.

Referring to FIGS. 1A to 6, the accommodating groove 31 may accommodate the first connection part 4, the second connection part 5, the elastic part 6, and a portion of the display panel 2. The accommodating groove 31 according to an embodiment may be a space surrounded by the upper frame 32, the lower frame 33, the side frame 34, and the guide roll 35. A portion of the display panel 2 may be disposed in a front portion to cover the accommodating groove 31, and the other portion of the display panel 2 and a cover may be disposed in a rear portion. In this case, as the display panel 2 is bent by the body 3, the display panel 2 may be disposed in the front portion, the rear portion, and a side surface of the other side 2b of the body 3. Although not shown, a printed circuit board (PCB) including circuits for driving of the display panel 2, communication, and driving of a set and a battery for supplying power to the PCB may be accommodated into the accommodating groove 31. The PCB and the battery may be disposed in an inner portion of the display panel 2 disposed in the front portion, the rear portion, and the side surface. That is, the PCB and the battery may be surrounded by the display panel 2. Therefore, the PCB and the battery may not interfere in movement of the display panel 2.

The upper frame 32 may be a frame which is disposed in an upper side of the display apparatus 1 as illustrated in FIGS. 1A to 5. The upper portion 21 of the display panel 2 may be coupled to the upper frame 32. The upper frame 32 may be provided in a wholly long oval shape, but is not limited thereto. The upper frame 32 may include a guide groove 321 for guiding the upper portion 21 of the display panel 2.

The guide groove 321 may be provided in an engraved form in the upper frame 32 as illustrated in FIGS. 2 and 4. Therefore, the upper portion 21 of the display panel 2 may be inserted into the guide groove 321. The display panel 2 inserted into the guide groove 321 may be moved along the guide groove 321 by a driving force generated by the user or the elastic part 6.

The guide groove 321 may be provided in a wholly laid U-shape in the upper frame 32. In this case, one side of the guide groove 321 may communicate with the outside so that the one side 2a of the display panel 2 is unloaded from the one side 3a of the body 3 by a certain distance. The other side of the guide groove 321 may not communicate with the outside so that, when the display panel 2 is moving in the inserting direction (the ID arrow direction), the other side 2b of the display panel 2 is supported by the upper frame 32 and thus does not move in the inserting direction (the ID arrow direction) any longer.

The guide groove 321 may further include a curve portion 321a, for bending the display panel 2. The curve portion 321a may be provided in the upper frame 32 so as to be disposed in the other side 3b of the body 3. The curve portion 321a may be provided in a semicircular shape, and a radius thereof may be set to be equal to or slightly greater than a radius of the guide roll 35 provided in a cylindrical shape. Therefore, the curve portion 321a may be provided to surround the guide roll 35. Accordingly, the display panel 2 disposed in the curve portion 321a may be bent to surround the guide roll 35.

The display apparatus 1 according to an embodiment of the present disclosure may be implemented so that the display panel 2 disposed in the curve portion 321a displays an image which differs from an image displayed by the display panel 2 disposed in a portion other than the curve portion 321a. For example, the display panel 2 disposed in the curve portion 321a may be a side region SA (illustrated in FIG. 1A) which displays simple information such as letters of Kakaotalk or other messaging application, date, time. The display panel 2 disposed in a portion other than the curve portion 321a may be a front region FA (illustrated in FIG. 1A) which displays the simple information in more detail or displays a large-screen image such as a television (TV) or movie. The side region SA may be disposed at different positions of the display panel 2, based on an unloaded state or an inserted state of the display panel 2. For example, when the display apparatus 1 is changed to the unloaded state, the other side 2b of the display panel 2 may move to be closer to the side region SA, and thus, the display panel 2 disposed in a below-described rear region BA (illustrated in FIG. 7A) in the inserted state may be disposed in the side region SA. Likewise, when the display apparatus 1 is changed to the inserted state, the other side 2b of the display panel 2 may move to be farther away from the side region SA, and thus, the display panel 2 disposed in the side region SA in the unloaded state may be disposed in the rear region BA. The display apparatus 1 according to an embodiment of the present disclosure may provide an image output signal corresponding to simple information to the display panel 2 disposed in the side region SA so that the display panel 2 disposed in the side region SA displays the simple information. Accordingly, the display apparatus 1 according to an embodiment of the present disclosure may always display simple information regardless of an unloaded state or an inserted state of the display panel 2 disposed in the curve portion 321a, thereby enabling the user to easily recognize the simple information.

In the display apparatus 1 according to an embodiment of the present disclosure, the display panel 2 may be divided into the front region FA, the side region SA, and the rear region BA. The front region FA, the side region SA, and the rear region BA of the display panel 2 may be provided to display different images. For example, the front region FA may display an image such as a TV or movie, the side region SA may display simple information such as letters, date, time, and the rear region BA may display icons such as applications. However, the present disclosure is not limited thereto. In other embodiments, at least two of the front region FA, the side region SA, and the rear region BA of the display panel 2 may be provided to display the same image.

The lower frame 33 may be a frame disposed in a lower portion of the display apparatus 1. The lower frame 33 may be spaced apart from the upper frame 32 by a certain distance. For example, the lower frame 33 may be spaced apart from the upper frame 32 by a length of the side frame 34. The lower portion 22 of the display panel 2 may be coupled to the lower frame 33. The lower frame 33 may be provided in the same shape as that of the upper frame 32, and thus, the upper portion 21 and the lower portion 22 of the display panel 2 may be maintained in a flat state. The lower frame 33 may include a guide groove for guiding the lower portion 22 of the display panel 2, like the guide groove 321 of the upper frame 32. The guide groove of the lower frame 33 may further include a curve portion. The guide groove and the curve portion of the lower frame 33 may be provided to be symmetrical with the guide groove 321 and the curve portion 321a of the upper frame 32, and in this regard, there may be a difference therebetween. However, the lower frame 33 and the upper frame 32 may have the same function and effect. Therefore, a detailed description thereof will be omitted.

The display apparatus 1 according to an embodiment of the present disclosure may be implemented as a compact type in that the display panel 2 is folded in a bent state by using the curve portion 321a of the guide groove 321. Also, in the display apparatus 1 according to an embodiment of the present disclosure, the upper portion 21 and the lower portion 22 of the display panel 2 may be respectively inserted into the guide groove of the upper frame 32 and the guide groove of the lower frame 33, and thus, the upper frame 32 and the lower frame 33 may support the display panel 2. Accordingly, even when the user touches the display panel 2, the display apparatus 1 according to an embodiment of the present disclosure may prevent deformation such as the display panel 2 being bent.

The side frame 34 may be disposed in the one side 3a of the body 3. The side frame 34 according to an embodiment may couple the upper frame 32 to the lower frame 33. The side frame 34 may be coupled to each of the upper frame 32 and the lower frame 33 by using various coupling methods such as an adhesive coupling method, a fitting-coupling method, and a bolt-coupling method. The side frame 34 may have a long rod shape which is long in length, and for example, may include a cross-sectional surface having a fan shape. As illustrated in FIG. 5, when the one side 2a of the display panel 2 is inserted into the body 3, the side frame 34 may contact a below-described first panel frame.

Referring again to FIGS. 2 and 4, the guide roll 35 may be disposed in the other side 3b of the body 3. The guide roll 35 according to an embodiment may be disposed between the upper frame 32 and the lower frame 33. The guide roll 35 may contact an inner surface of the display panel 2. In more detail, the guide roll 35 may contact a bending portion of the display panel 2 disposed in the curve portion 321a. Here, the inner surface of the display panel 2 may be a non-display area which does not display an image. Accordingly, the guide roll 35 may support the bending portion of the display panel 2, thereby preventing deformation where the bending portion of the display panel 2 is recessed toward the accommodating groove 31 or is changed to a flat shape.

The guide roll 35 may rotate based on moving of the display panel 2. The guide roll 35 according to an embodiment may counterclockwise rotate when the one side 2a of the display panel 2 moves in the unloading direction (the OD arrow direction). The guide roll 35 according to an embodiment may clockwise rotate when the one side 2a of the display panel 2 moves in the inserting direction (the ID arrow direction). However, the rotation direction of the guide roll 35 is not limited thereto. For example, when the display panel 2 moves in the unloading direction, the guide roll 35 may also clockwise rotate. Accordingly, in the display apparatus 1 according to an embodiment of the present disclosure, since the guide roll 35 rotates along with moving of the display panel 2, the bending portion of the display panel 2 may be prevented from being deformed in shape, and moreover, friction occurring in the display panel 2 may decrease compared to a case where there is no rotation, thereby extending a lifetime of the display panel 2.

In the display apparatus 1 according to an embodiment of the present disclosure, it has been described that the upper frame 32, the lower frame 33, the side frame 34, and the guide roll 35 are separately manufactured and are coupled to the body 3, but the present disclosure is not limited thereto. In other embodiments, unless the guide roll 35 rotates, the upper frame 32, the lower frame 33, the side frame 34, and the guide roll 35 may be provided as one body. When the body 3 is provided as one body, a time taken in manufacturing a finished display apparatus 1 may be shortened.

Alternatively, the upper frame 32, the lower frame 33, and the side frame 34 other than the guide roll 35 may be provided as one body and only the guide roll 35 may be separately manufactured, and the upper frame 32, the lower frame 33, and the side frame 34 may be rotatably coupled to the guide roll 35. The upper frame 32, the lower frame 33, the side frame 34, and the guide roll 35 may be provided to surround an edge of the display panel 2, thereby protecting the display panel 2 from an impact applied from the outside.

Referring to FIGS. 1A to 5, the first connection part 4 may connect the body 3 to the display panel 2. One side of the first connection part 4 according to an embodiment, as illustrated in FIG. 3A, may be fixed to the one side 3a of the body 3 close to the upper frame 32, and the other side of the first connection part 4 may be fixed to the other side 2b of the display panel 2 close to the upper frame 32. The one side 3a of the body 3 close to the upper frame 32 may be an upper corner portion of the accommodating groove 31. The one side of the first connection part 4 may be fixed to the body 3 by a below-described first fixture, which may be referred to herein as a "first fixing part 7," and the other side of the first connection part 4 may be fixed to the other side 2b of the display panel 2 by a below-described second panel frame 11. The first fixing part 7 may be coupled to a below-described cover 12 and may support the one side of the first connection part 4. The first connection part 4 may be formed of a metal material, but is not limited thereto.

The second connection part 5 may connect the body 3 to the display panel 2 at a position spaced apart from the first connection part 4. One side of the second connection part 5 according to an embodiment, as illustrated in FIG. 3A, may be fixed to the one side 3a of the body 3 close to the lower frame 33, and the other side of the second connection part 5 may be fixed to the other side 2b of the display panel 2 close to the lower frame 33. The one side 3a of the body 3 close to the lower frame 33 may be a lower corner portion of the accommodating groove 31. The one side of the second connection part 5 may be fixed to the body 3 by a below-described second fixture, which may be referred to herein as a "second fixing part 8," and the other side of the second connection part 5 may be fixed to the other side 2b of the display panel 2 by the below-described second panel frame 11. The second fixing part 8 may be coupled to the below-described cover 12 and may support the one side of the second connection part 5. The second connection part 5 may be formed of the same material as that of the first connection part 4, but the embodiments of the present disclosure are not limited thereto. The second connection part 5 may be disposed in a symmetrical form with respect to the first connection part 4 based on the elastic part 6.

The elastic part 6 may be elastically connected between the first connection part 4 and the second connection part 5. The elastic part 6 according to an embodiment may be formed of a material having elasticity, and thus, may contract based on an elastic restoring force to pull the first connection part 4 and the second connection part 5 so that the first connection part 4 and the second connection part 5 are put in a tight state. The elastic part 6 contracted by the elastic restoring force may be provided to have a length which is shorter than a length L1 (illustrated in FIG. 6) between the upper portion 21 and the lower portion 22 of the display panel 2. The elastic part 6 may pull the first connection part 4 and the second connection part 5 with the elastic restoring force at a position corresponding to half of a length of each of the first connection part 4 and the second connection part 5. Therefore, with respect to the elastic part 6, the first connection part 4 and the second connection part 5 may be symmetrical with each other in a vertical direction and a horizontal direction. Here, the vertical direction may denote a direction in which the upper frame 32 and the lower frame 33 are disposed, and the horizontal direction may denote a direction in which the one side 3a and the other side 3b of the body 3 are disposed. Also, the elastic part 6 may contract at a position instead of the position corresponding to half of a length of each of the first connection part 4 and the second connection part 5 and may pull the first connection part 4 and the second connection part 5.

When the one side 2a of the display panel 2 is moved in the unloading direction OD by an action of the user's hand and is unloaded from the body 3, the elastic part 6 may stretch, and when the elastic part 6 contracts based on the elastic restoring force, the display panel 2 may move in the inserting direction ID so that the one side 2a of the display panel 2 is inserted into the body 3. An elastic direction of the elastic part 6 may differ from a moving direction of the display panel 2. For example, as illustrated in FIGS. 3A and 3B, the elastic direction of the elastic part 6 may be a vertical direction, and a moving direction of the display panel 2 may be a horizontal direction.

In more detail, when the display panel 2 is moved by an action of the user's hand so that the display apparatus 1 is put in an unloaded state, the other side 2b of the display panel 2 may be farther away from the side frame 34, and thus, the first connection part 4 and the second connection part 5 may be tightened in a horizontal direction to stretch the elastic part 6 in a vertical direction. For example, as the first connection part 4 is tightened as illustrated in FIG. 3B, an upper portion of the elastic part 6 may move in a D1 arrow direction, and as the second connection part 5 is tightened, a lower portion of the elastic part 6 may move and stretch in a D2 arrow direction. Therefore, in an unloaded state, a separation distance between the first connection part 4 and the second connection part 5 each connected to the elastic part 6 may increase based on an action of the user's hand. Here, the vertical direction may be a direction parallel to the side frame 34. The horizontal direction may be a direction parallel to the upper frame 32. On the other hand, when the stretched elastic part 6 is contracted by the elastic restoring force, the first connection part 4 and the second connection part 5 may be folded with respect to the elastic part 6, and thus, the other side 2b of the display panel 2 may move to be closer to the side frame 34, whereby the display apparatus 1 may be changed to an inserted state. Therefore, in the inserted state, the elastic part 6 may decrease the separation distance between the first connection part 4 and the second connection part 5 each connected to the elastic part 6. Here, each of the first connection part 4 and the second connection part 5 being folded in the inserted state may denote that an angle of a V-shaped portion connected to the elastic part 6 is decreased. On the other hand, an angle of the V-shaped portion may increase in the unloaded state. Accordingly, the display apparatus 1 according to an embodiment of the present disclosure may extend and reduce the display panel 2 with only an action of the user's hand by using the elastic part 6 without a separate driving power, and thus, total size and weight may decrease, thereby increasing the convenience of keeping and movement.

The elastic part 6 may include a band or a compression spring, but is not limited thereto and may include another material having elasticity.

The elastic part 6 may include a first through hole 61 and a second through hole 62 with respect to FIG. 3A. The first through hole 61 may connect the elastic part 6 to the first connection part 4 and may be provided to pass through a body configuring the elastic part 6 in an upper portion of the elastic part 6. In this case, a through direction of the first through hole 61 may be the same as a moving direction of the display panel 2. Therefore, the first through hole 61 may minimize friction occurring between the first connection part 4 and the elastic part 6. The first through hole 61 may be provided in a rectilinear shape, but is not limited thereto and may be provided in another shape such as a V-shape for decreasing the friction occurring between the first connection part 4 and the elastic part 6.

The second through hole 62 may connect the elastic part 6 to the second connection part 5 and may be provided to pass through the body configuring the elastic part 6 in a lower portion of the elastic part 6. In this case, a through direction of the second through hole 62 may be the same as a moving direction of the display panel 2. Therefore, the second through hole 62 may minimize friction occurring between the second connection part 5 and the elastic part 6. The second through hole 62 may be provided in a rectilinear shape, but is not limited thereto and may be provided in another shape such as an inverted V-shape for decreasing the friction occurring between the second connection part 5 and the elastic part 6.

Although not shown, a material such as reinforce plastic or metal robust to friction may be coated on a body which configures the first through hole 61 and the second through hole 62, for increasing a lifetime of the elastic part 6.

In addition to the first and second through holes 61 and 62, a protrusion portion having a shape matching the Korean letter "ㄱ" or a V-shaped cut groove, may be provided in both ends of the elastic part 6, and the first connection part 4 and the second connection part 5 may be hung up on the both ends of the elastic part 6 and may be connected to each other.

Referring again to FIGS. 3A and 3B, the display apparatus 1 according to an embodiment of the present disclosure may include a first fixing part 7, a second fixing part 8, and a third connection part 9. In FIGS. 3A and 3B, the unloading direction (the OD arrow direction) and the inserting direction (the ID arrow direction) are illustrated with respect to a moving direction of the elastic part 6 or the second panel frame 11.

The first fixing part 7 may couple one side of the first connection part 4 to the body 3. The first fixing part 7 according to an embodiment may couple the one side of the first connection part 4 to the cover 12 included in the body 3. In more detail, the first fixing part 7 may couple the one side of the first connection part 4 to a portion (i.e., a corner of the accommodating groove 31) near a position at which the upper frame 32 is coupled to the side frame 34. Therefore, the one side of the first connection part 4 may maintain a state fixed to the corner of the cover 12 by the first fixing part 7. For example, the first fixing part 7 may be a bolt, but is not limited thereto and may be another fixing means for coupling the one side of the first connection part 4 to the cover 12.

The second fixing part 8 may couple one side of the second connection part 5 to the body 3. The second fixing part 8 according to an embodiment may couple the one side of the second connection part 5 to the cover 12 included in the body 3. In more detail, the second fixing part 8 may couple the one side of the second connection part 5 to a portion (i.e., the corner of the accommodating groove 31) near a position at which the lower frame 33 is coupled to the side frame 34. Therefore, the one side of the second connection part 5 may maintain a state fixed to the corner of the cover 12 by the second fixing part 8. For example, the second fixing part 8 may be a bolt, but is not limited thereto and may be another fixing means for coupling the one side of the second connection part 5 to the cover 12.

The second fixing part 8 may couple the one side of the second connection part 5 to the body 3 at a position spaced apart from the first fixing part 7. For example, as illustrated in FIG. 3B, the second fixing part 8 may be coupled to the body 3 so that the third connection part 9 connecting the one side of the first connection part 4 to the one side of the second connection part 5 is disposed vertical to a moving direction (i.e., the unloading direction (the OD arrow direction) or the inserting direction (the ID arrow direction)) of the display panel 2. In this case, the third connection part 9 may be disposed in parallel with the side frame 34. Therefore, the first connection part 4 and the second connection part 5 may be symmetrical with each other in a vertical direction and a horizontal direction with respect to the elastic part 6. Since the first connection part 4 and the second connection part 5 are provided to be symmetrical, the elastic part 6 may apply the same elastic restoring force to the first connection part 4 and the second connection part 5. Accordingly, in the display apparatus 1 according to an embodiment of the present disclosure, when the unloaded state is changed to the inserted state, the elastic part 6 may apply the same force to the upper portion 21 and the lower portion 22 of the display panel 2 to move the upper portion 21 and the lower portion 22 of the display panel 2 by the same distance in the inserting direction (the ID arrow direction), thereby preventing shape deformation such as the display panel 2 being crumpled.

The third connection part 9 may connect the one side of the first connection part 4 to the one side of the second connection part 5. The third connection part 9 according to an embodiment may connect the one side of the first connection part 4 to the one side of the second connection part 5 by using the adhesive coupling method or the like, but is not limited thereto and may be provided as one body with the first connection part 4 and the second connection part 5. Since the third connection part 9 connects the one side of the first connection part 4 to the one side of the second connection part 5, the first connection part 4, the second connection part 5, and the third connection part 9 may be provided in one row. The third connection part 9 may be formed of the same material as that of each of the first connection part 4 and the second connection part 5, but is not limited thereto and may be formed of another material for connecting the first connection part 4 to the second connection part 5. Therefore, in the display apparatus 1 according to an embodiment of the present disclosure, the first connection part 4 and the second connection part 5 may be easily fixed to the body 3 by merely hanging up the first to third connection parts 4, 5, and 9, arranged in one row, on the first fixing part 7 and the second fixing part 8, and thus, a time taken in manufacturing a finished display apparatus may be shortened compared to a case where the first fixing part 7 and the second fixing part 8 individually fix the one side of the first connection part 4 and the one side of the second connection part 5 to the body 3.

Referring to FIGS. 2 to 6, the display apparatus 1 according to an embodiment of the present disclosure may include a first panel frame 10 and the second panel frame 11.

The first panel frame 10 may be coupled to the one side 2a of the display panel 2 so as to be disposed between the upper portion 21 and the lower portion 22 of the display panel 2. The first panel frame 10 according to an embodiment may be provided in a rod shape where a cross-sectional surface is provided in an arrowhead shape. The first panel frame 10 may be formed of a metal material, but is not limited thereto and may be formed of a plastic material for weight-lightness. The first panel frame 10 may be closely coupled to the display panel 2 from the one side 2a to the upper portion 21 and the lower portion 22 of the display panel 2, and thus, even when the one side 2a of the display panel 2 is unloaded from the body 3, flatness of the display panel 2 may be maintained. The first panel frame 10 may include an inserting member 101 and a protrusion member 102.

The inserting member 101 may be inserted into the body 3 when the display apparatus 1 is changed from the unloaded state to the inserted state. The inserting member 101 according to an embodiment may be provided in a rod shape where a cross-sectional surface is tetragonal. The inserting member 101 may be coupled to the one side 2a of the display panel 2. For example, the inserting member 101 may be coupled to the display panel 2 in a lengthwise direction of each of the upper portion 21 and the lower portion 22 of the display panel 2 by using various coupling methods such as the adhesive coupling method and the fitting-coupling method. The inserting member 101 may be inserted into an inserting groove 36 provided in the body 3. The inserting groove 36 may be provided in an engraved form in the upper frame 32 and may communicate with the guide groove 321. Therefore, when the unloaded state is changed to the inserted state, the inserting member 101 may move in the inserting direction (the ID arrow direction) along with the display panel 2 and may be inserted into the inserting groove 36. As the inserting member 101 is inserted into the inserting groove 36, the one side 2a of the display panel 2 may be disposed inside the body 2.

The inserting groove 36, as illustrated in FIG. 4, may be provided just on a position at which the side frame 34 is coupled to the upper frame 32. Therefore, when the inserting member 101 is inserted into the inserting groove 36, the side frame 34 may contact the inserting member 101. Therefore, the side frame 34 may support the inserting member 101, and thus, may prevent the display panel 2 from being bent toward the accommodating groove 31 in the inserted state, thereby maintaining flatness of the display panel 2. The inserting groove 36 may be provided to be thicker in thickness than that of the guide groove 321 so that the inserting member 101 thicker in thickness than the display panel 2 is inserted thereinto.

The protrusion member 102 may expose a portion, other than a portion of the inserting member 101 inserted into the inserting groove 36, of the inserting member 101 at the outside of the body 3. The protrusion member 102 may be provided in a shape which protrudes from the portion, which is not inserted into the inserting groove 36, of the inserting member 101. The protrusion member 102 according to an embodiment may protrude in an upward direction from the inserting member 101 and may be provided in a shape where a size is progressively reduced in the upward direction. For example, the protrusion member 102 may be provided in a fan shape. In this case, a vertical surface of the protrusion member 102 vertical to the inserting member 101 may be supported by the body 3 in the inserted state. In more detail, the vertical surface of the protrusion member 102 may be supported by the upper frame 32 disposed on the inserting groove 36. Accordingly, the display apparatus 1 according to an embodiment of the present disclosure may provide the following effects.

First, in the display apparatus 1 according to an embodiment of the present disclosure, even when the first panel frame 10 is changed from the unloaded state to the inserted state, the one side 2a of the display panel 2 may be prevented from being inserted into the body 3, thereby maintaining a size of the display panel 2 of the front region FA without a separate fixing device.

Second, in the display apparatus 1 according to an embodiment of the present disclosure, a portion of the inserting member 101 may be exposed at the outside due to the protrusion member 102, and thus, the user may easily change the display panel 2 to the unloaded state or the inserted state with holding the inserting member 101 or the protrusion member 102 each exposed at the outside with a hand.

Third, in the display apparatus 1 according to an embodiment of the present disclosure, since the first panel frame 10 is provided to surround the one side 2a of the display panel 2, the one side 2a of the display panel 2 may be protected from an external impact, thereby more increasing a lifetime of the display panel 2.

Referring to FIGS. 2 to 6, the display apparatus 1 according to an embodiment of the present disclosure may include the second panel frame 11.

The second panel frame 11 may connect the first connection part 4 and the second connection part 5 to the display panel 2. The second panel frame 11 according to an embodiment may be coupled to the other side of the first connection part 4 and the other side of the second connection part 5 by using various coupling methods such as the adhesive coupling method, the fitting-coupling method, and the bolt-coupling method. The second panel frame 11 may be provided as one body with the first connection part 4 and the second connection part 5 by using a die-casting method. The second panel frame 11 may be formed of a metal material, but is not limited thereto and may be formed of a plastic material for weight-lightness.

The second panel frame 11 may be coupled to the other side 2b of the display panel 2. The second panel frame 11 may be disposed between the upper portion 21 and the lower portion 22 of the display panel 2, and as illustrated in FIG. 6, a length L2 may be set to be shorter than a length L1 between the upper portion 21 and the lower portion 22 of the display panel 2. In this case, the second panel frame 11 may be disposed at a middle position between the upper portion 21 and the lower portion 22 of the display panel 2. Therefore, as illustrated in FIG. 3A, the upper portion 21 and the lower portion 22 other than a portion where the second panel frame 11 is disposed in the other side 2b of the display panel 2 may be respectively inserted into the guide groove 321 of the upper frame 32 and a guide groove of the lower frame 33. In this case, both ends of the second panel frame 11 may contact the upper frame 32 and the lower frame 33, and thus, in a process of changing the display panel 2 to the unloaded state or the inserted state, the second panel frame 11 may be guided by the upper frame 32 and the lower frame 33 according to moving of the display panel 2. Therefore, in the other side 2b of the display panel 2, the display panel 2 inserted into the guide groove provided in each of the upper frame 32 and the lower frame 33 and the second panel frame 11 accommodated into the accommodating groove 31 may be respectively supported by the upper frame 32 and the lower frame 33, and thus, the second panel frame 11 may be guided by the upper frame 32 and the lower frame 33 while the display panel 2 is moving. The second panel frame 11 may be closely coupled to the other side 2b of the display panel 2 in a vertical direction, and thus, the second panel frame 11 may flatly maintain the other side 2b of the display panel 2.

The second panel frame 11 may be coupled to the non-display area (i.e., a rear surface, which does not display an image, of the display panel 2) of the display panel 2, and as illustrated in FIG. 4, the second panel frame 11 may be disposed more inward than the display panel 2 in the accommodating groove 31. Therefore, the first and second connection parts 4 and 5 coupled to the second panel frame 11 at the other side thereof may be spaced apart from the cover 12 of the body 3 to the front region FA by a certain distance, and the elastic part 6 connected to the first and second connection parts 4 and 5 may be spaced apart from the cover 12 of the body 3 to the front region FA by a certain distance. Accordingly, in the display apparatus 1 according to an embodiment of the present disclosure, a degree to which the elastic part 6 contacts the cover 12 may be minimized, and thus, friction between the elastic part 6 and the cover 12 may decrease in a process of changing the display panel 2 to the unloaded state or the inserted state, thereby increasing a lifetime of the elastic part 6. Also, the display apparatus 1 according to an embodiment of the present disclosure may prevent noise from occurring due to friction between the elastic part 6 and the cover 12 in a process of changing the display panel 2 to the unloaded state or the inserted state.

The display apparatus 1 according to an embodiment of the present disclosure may be implemented so that the elastic part 6 is disposed between the side frame 34 and the second panel frame 11 as illustrated in FIGS. 3A and 3B. This is for placing the elastic part 6 in an edge in the accommodating groove 31 in the inserted state. Since the elastic part 6 is disposed in the edge in the inserted state, a size of the display panel 2 inserted into the accommodating groove 31 may increase, and thus, the display apparatus 1 may be implemented to be more compact. Also, a size of the display panel 2 unloaded from the body 3 may more increase in the unloaded state, and thus, the user may see a larger screen. Also, in the display apparatus 1 according to an embodiment of the present disclosure, since the elastic part 6 is disposed between the side frame 34 and the second panel frame 11, interference by the elastic part 6 may be prevented when moving the display panel 2, and thus, damage of the display panel 2 may be prevented and the user may smoothly move the display panel 2 with a small force.

Figure 7A:
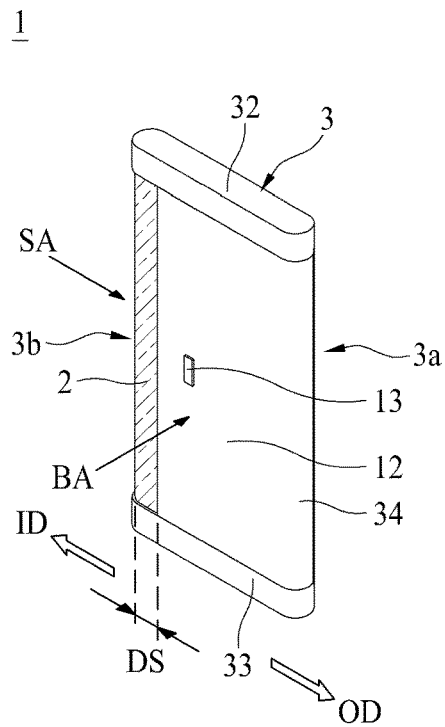
FIG. 7A is a schematic rear perspective view of FIG. 1A.
Figure 7B:
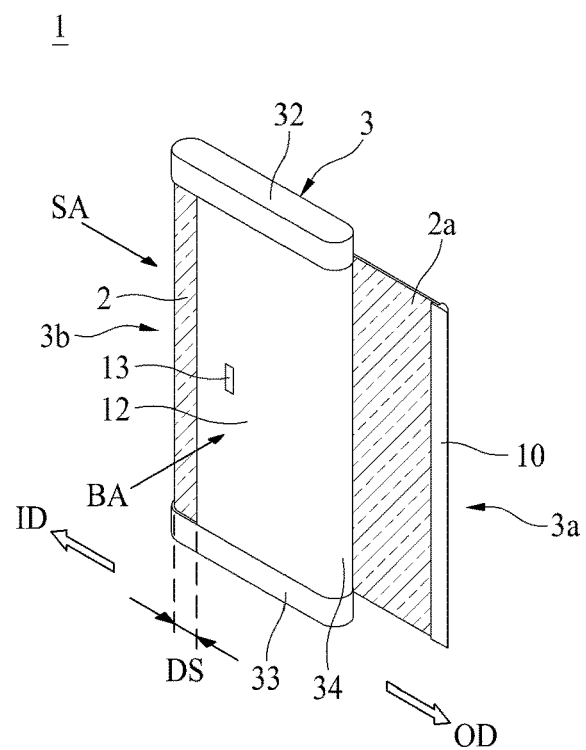
FIG. 7B is a schematic rear perspective view of FIG. 1B.
Figure 8A:
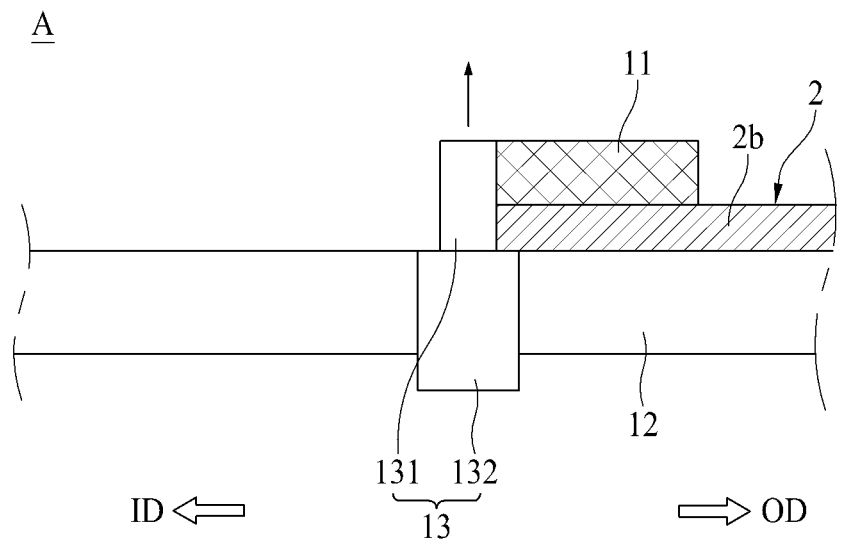
FIGS. 8A and 8B are schematic operating state views of a portion A illustrated in FIG. 3B.
Figure 8B:
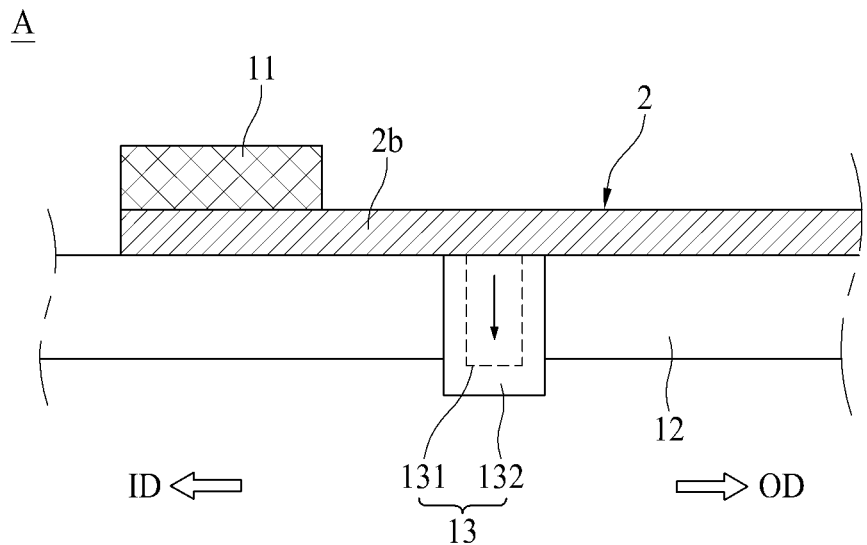

FIG. 7A is a schematic rear perspective view of FIG. 1A, and FIG. 7B is a schematic rear perspective view of FIG. 1B. FIGS. 8A and 8B are schematic operating state views of a portion A illustrated in FIG. 3B.

Referring to FIGS. 7A to 8B, the display apparatus 1 according to an embodiment of the present disclosure may include the cover 12 and a button, which may be referred to herein as a "button part 13."

The cover 12 may cover the accommodating groove 31. The cover 12 according to an embodiment may be coupled to the body 3 so as to be disposed on the rear surface of the display apparatus 1. The cover 12 may be coupled to the upper frame 32, the lower frame 33, and the side frame 34 of the body 3. The cover 12 may be provided in a wholly tetragonal plate shape, but is not limited thereto and may be provided in another shape which is coupled to the body 3 to cover the accommodating groove 31. The cover 12 may be formed of the same material as that of the body 3 to enhance a sense of unity and a sense of beauty, but is not limited thereto and may be formed of another material. The cover 12 may be formed of a plastic material for weight-lightness. A surface, exposed to the outside, of the cover 12 may be provided to have various patterns such as a concave-convex pattern for preventing sliding of the user's hand.

The cover 12 may be provided to have a size smaller than that of the accommodating groove 31 in a horizontal direction as illustrated in FIGS. 4, 5, and 7A. Therefore, a separation space DS may be provided between the cover 12 and the guide roll 35. In more detail, the separation space DS may be provided between the cover 12 and a rotational shaft of the guide roll 35. The display apparatus 1 may be implemented so that the display panel 2 is bent with respect to the guide roll 35, a portion thereof may be disposed in the front portion, and the other portion thereof may be disposed in the rear portion. Therefore, the other bent portion of the display panel 2 may be disposed in the separation space DS. Accordingly, the display panel 2 disposed in the separation space DS may cover the accommodating groove 31 so that the accommodating groove 31 is not exposed at the outside.

The display panel 2 disposed in the separation space DS may display an image. A region, displaying an image, of the display panel 2 in the separation space DS may be the rear region BA (illustrated in FIG. 7A). Therefore, the display panel 2 may be divided into the front region FA, the side region SA, and the rear region BA. The display apparatus 1 according to an embodiment of the present disclosure may be implemented so that the front region FA, the side region SA, and the rear region BA of the display panel 2 display different images. For example, the front region FA may display an image such as a TV or movie, the side region SA may display simple information such as letters, date, time, and the rear region BA may display icons such as applications.

Moreover, as a size of the cover 12 decreases, the rear region BA of the display panel 2 may relatively increase, and the rear region BA may display an image which is the same as or different from an image displayed by the front region FA.

Different images displayed by the regions may be implemented by the PCB transferring different image signals to the regions. Accordingly, the display apparatus 1 according to an embodiment of the present disclosure may enable the user to quickly recognize various information from different images displayed at different positions, thereby enhancing convenience of the user for acquiring information.

A position of the side region SA in the display panel 2 may be changed based on the unloaded state or the inserted state. For example, the side region SA may be disposed at a first side position of the display panel 2 in the inserted state illustrated in FIG. 1A, and in the unloaded state illustrated in FIG. 1B, may be disposed at a second side position of the display panel 2. The first side position may be disposed closer to the one side 2a of the display panel 2 than the second side position. When the display apparatus 1 according to an embodiment of the present disclosure is in the unloaded state, the side region SA in the inserted state may be changed to the front region FA, and thus, the user may see a wide screen, thereby increasing satisfaction of the user for seeing an image.

That is, the front region FA may be larger in a case, where the display panel 2 is in the unloaded state, than a case where the display panel 2 is in the inserted state, and thus, the user may see a wide screen, thereby increasing satisfaction of the user for seeing an image and providing the user with more image information.

In addition to the first fixing part 7 and the second fixing part 8 each described above, the button part 13 may be coupled to the cover 12. The button part 13 is for limiting movement of the display panel 2. In more detail, the button part 13 may prevent the one side 2a, unloaded from the body 3, of the display panel 2 from being inserted into the body 3 in a process of changing the inserted state to the unloaded state. That is, even when the user moves the display panel 2 to be put in the unloaded state and then detaches a hand from the display panel 2, the button part 13 may maintain the display panel 2 in the unloaded state. The button part 13 may support at least one of the other side 2b of the display panel 2 and the second panel frame 11 to maintain the display panel 2 in the unloaded state.

The button part 13 may be disposed closer to the guide roll 35 than the side frame 34 in the cover 12 as illustrated in FIG. 7A. This is because, when the one side 2a of the display panel 2 is unloaded from the body 3, the other side 2b of the display panel 2 gets close to the guide roll 35. When the other side 2b of the display panel 2 and the second panel frame 11 passes by an upper portion of the button part 13 and gets close to the guide roll 35, the button part 13 may protrude to the accommodating groove 31 and may support at least one of the other side 2b of the display panel 2 and the second panel frame 11, thereby maintaining the display panel 2 in the unloaded state. The button part 13 may automatically protrude to the accommodating groove 31 and may support at least one of the other side 2b of the display panel 2 and the second panel frame 11, but is not limited thereto. In other embodiments, the button part 13 may manually protrude to the accommodating groove 31 on the basis of a hand action where the user presses the button part 13 and may support at least one of the other side 2b of the display panel 2 and the second panel frame 11.

The button part 13 may be disposed between the upper frame 32 and the lower frame 33. This is for enabling fingers of the user to easily approach the button part 13 when the user grips the display apparatus 1 in a hand. Therefore, the button part 13 may support a center portion of the second panel frame 11. The user may press the button part 13 to change the display apparatus 1 from the unloaded state to the inserted state. For example, when the user presses the button part 13, supporting of the other side 2b of the display panel 2 and the second panel frame 11 may be released, and thus, the one side 2a of the display panel 2 may be inserted into the inserting groove 36, whereby the display apparatus 1 is changed to the inserted state. In the display apparatus 1 according to an embodiment of the present disclosure, one of two hands may grip the body 3, and the other hand may press the button part 13, thereby implementing the inserted state. However, one hand may grip the body 3, and in this state, a finger of the one hand may press the button part 13, thereby changing the display apparatus 1 from the unloaded state to the inserted state. The button part 13 may include a supporting member 131 and a button member 132.

The supporting member 131, as illustrated in FIGS. 8A and 8B, may be movably coupled to the button member 132. When the user presses the button member 132, a portion of the supporting member 131 may protrude the cover 12 to the accommodating groove 31, and thus, the supporting member 131 may support at least one of the other side 2b of the display panel 2 and the second panel frame 11. When the other side 2b of the display panel 2 and the second panel frame 11 moves in the unloading direction (the OD arrow direction), a portion of the supporting member 131 may automatically protrude to the accommodating groove 31 by using an elastic member of the button part 13 and may support at least one of the other side 2b of the display panel 2 and the second panel frame 11. Therefore, the display apparatus 1 according to the present disclosure may be changed to the unloaded state. When the user presses the button member 132, the protruding portion of the supporting member 131 may move from the accommodating groove 31 to the cover 12 and may release supporting of the other side 2b of the display panel 2 and the second panel frame 11.

Accordingly, the display apparatus 1 may be changed to the inserted state. In this case, the supporting member 131 may be inserted into the button member 132. The supporting member 131 may be provided in a wholly cylindrical shape, but is not limited thereto and may be provided in another shape which enables the supporting member 131 to be moved by the button member 132 and to support at least one of the other side 2b of the display panel 2 and the second panel frame 11.

The button member 132 may be coupled to the cover 12. The button member 132 may be movably coupled to the cover 12, but is not limited thereto and may move the supporting member 131 with being fixed to the cover 12. The button part 132 may be provided to have a size which is greater than that of the supporting member 131, and thus, the supporting member 131 may be inserted into the button part 132. Although not shown, the button member 132 may further include the elastic member for moving the supporting member 131 to an inner portion of the button member 132 or moving the supporting member 131 to the accommodating groove 31.

The button member 132 may be provided so that a portion thereof protrudes from the cover 12 in a direction from the accommodating groove 31 to the outside. Therefore, in the display apparatus 1 according to an embodiment of the present disclosure, accessibility of the user to the protruding button member 132 may increase, and thus, even without directly seeing the button member 132 disposed on the rear surface, the user may press the button member 132 to easily change the display panel 2 from the unloaded state to the inserted state.

Although not shown, in a case where the display apparatus 1 according to an embodiment of the present disclosure is implemented so that the button part 13 is provided in the upper frame 32 or the lower frame 33 and supports an upper or lower portion of the second panel frame 11, the button part 13 may be removed from the cover 12, and thus, a size of the cover 12 in a horizontal direction may be more reduced. Therefore, in the display apparatus 1 according to an embodiment of the present disclosure, a size of the rear region BA of the display panel 2 may more increase in the inserted state, and thus, the user may see, through the rear region BA, a large-screen image such as a TV or movie. In such a structure, however, when the display panel 2 is changed to the unloaded state, an inner portion of the accommodating groove 31 may be exposed at the outside due to the reduced cover 12, and thus, the display apparatus 1 may further include a sheet of material, which may be a decorative part. One side of the decorative part may be connected and fixed to the cover 12, and the other side may be connected to the other side 2b of the display panel 2 and may be folded or unfolded based on movement of the display panel 2 to cover the inner portion of the accommodating groove 31 uncovered by the cover 12.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The invention claimed is:

1. A display apparatus comprising:
   a display panel;
   a body, the display panel movably coupled to the body;
   a first connection rod connecting the body to the display panel;
   a second connection rod connecting the body to the display panel, the second connection rod disposed apart from the first connection rod;
   a member of elastic material connected to the first connection rod and to the second connection rod; and
   a panel frame coupled to one side of the display panel and disposed between an upper portion and a lower portion of the display panel,
   wherein the member of elastic material contracts based on an elastic restoring force to decrease a separation distance between the first connection rod and the second connection rod,
   wherein the body comprises an inserting groove, and a portion of the panel frame is inserted into the inserting groove.

2. The display apparatus of claim 1, wherein the body comprises an accommodating groove accommodating the first connection rod, the second connection rod, the member of elastic material, and a portion of the display panel.

3. The display apparatus of claim 2, further comprising:
   a cover coupled to the body to cover the accommodating groove; and
   a button coupled to the cover to limit movement of the display panel.

4. The display apparatus of claim 1, wherein the body comprises:
   an upper frame, an upper portion of the display panel coupled to the upper frame; and
   a lower frame, a lower portion of the display panel coupled to the lower frame,
   wherein each of the upper frame and the lower frame comprises a guide groove that, in operation, guides movement of the display panel.

5. The display apparatus of claim 4, wherein the guide groove of each of the upper frame and the lower frame communicates with an outside of the body so that a portion of the display panel can be unloaded to the outside of the body.

6. The display apparatus of claim 4, further comprising a guide roll disposed between the upper frame and the lower frame and disposed at one side of the body,
   wherein the guide groove of each of the upper frame and the lower frame comprises a curve portion so that the display panel is bent to surround a portion of the guide roll.

7. The display apparatus of claim 6, wherein the guide roll rotates based on moving of the display panel.

8. The display apparatus of claim 6, wherein the display panel disposed in the curve portion displays an image differing from an image displayed by the display panel disposed in a portion other than the curve portion.

9. The display apparatus of claim 6, further comprising a side frame disposed between an upper frame and a lower frame and in one side of the body,
   wherein the side frame contacts the first panel frame inserted into the inserting groove.

10. The display apparatus of claim 1, wherein the panel frame comprises:
an inserting member, wherein a portion of the inserting member is inserted into the inserting groove; and
a protrusion member protruding from the inserting member and exposed at an outside of the body, and
the protrusion member is supported by the body.

11. The display apparatus of claim 1, further comprising:
a first fixture coupling one side of the first connection rod to the body;
a second fixture disposed apart from the first fixture to couple one side of the second connection rod to the body; and
a third connection rod connecting the one side of the first connection rod to the one side of the second connection rod,
wherein the first fixture and the second fixture are coupled to the body so that the third connection rod is disposed vertical and transverse to a moving direction of the display panel.

12. The display apparatus of claim 1, wherein the member of elastic material comprises:
a first through hole, the first connection rod passing through the first through hole; and
a second through hole, the second connection rod passing through the second through hole, and
the first through hole is spaced apart from the second through hole.

13. The display apparatus of claim 1, wherein the member of elastic material comprises a band having elasticity or a compression spring having elasticity.

14. The display apparatus of claim 1, wherein:
when one side of the display panel is unloaded from the body, the member of elastic material stretches, and when the member of elastic material contracts based on an elastic restoring force, the member of elastic material moves the display panel so that one side of the display panel is inserted into the body, and
an elastic direction of the member of elastic material differs from a moving direction of the display panel.

15. The display apparatus of claim 1, wherein the first connection rod and the second connection rod are disposed to be symmetrical with each other.

16. A display apparatus comprising:
a display panel;
a body, the display panel movably coupled to the body;
a first connection rod connecting the body to the display panel;
a second connection rod connecting the body to the display panel, the second connection rod disposed apart from the first connection rod;
a member of elastic material connected to the first connection rod and to the second connection rod; and
a panel frame connecting the first connection rod and the second connection rod to the display panel,
wherein the member of elastic material contracts based on an elastic restoring force to decrease a separation distance between the first connection rod and the second connection rod, and
wherein the panel frame is disposed between an upper portion and a lower portion of the display panel and is coupled to a side of the display panel.

17. The display apparatus of claim 16, wherein the panel frame has a length which is shorter than a length between the upper portion and the lower portion of the display panel.

18. The display apparatus of claim 16, further comprising a side frame disposed between an upper frame and a lower frame and in the one side of the body,
wherein the member of elastic material is disposed between the side frame and the panel frame.

* * * * *

UNITED STATES PATENT AND TRADEMARK OFFICE
CERTIFICATE OF CORRECTION

PATENT NO. : 10,757,823 B2  
APPLICATION NO. : 16/509355  
DATED : August 25, 2020  
INVENTOR(S) : Sangdae Park Page 1 of 1

It is certified that error appears in the above-identified patent and that said Letters Patent is hereby corrected as shown below:

In the Claims

Column 20, Claim 9, Line 63:
"claim 6, further" should read: --claim 1, further--.

Signed and Sealed this
Fifteenth Day of December, 2020

Andrei Iancu
*Director of the United States Patent and Trademark Office*